United States Patent [19]

Götze et al.

[11] 4,380,811
[45] Apr. 19, 1983

[54] PROGRAMMABLE LOGIC ARRAY WITH SELF CORRECTION OF FAULTS

[75] Inventors: Volkmar Götze, Grafenau; Dieter Schütt, Munich, both of Fed. Rep. of Germany

[73] Assignee: International Business Machines Corp., Armonk, N.Y.

[21] Appl. No.: 254,027

[22] Filed: Apr. 14, 1981

[30] Foreign Application Priority Data

Apr. 25, 1980 [DE] Fed. Rep. of Germany ....... 3015992

[51] Int. Cl.³ .................. G01R 31/28; G11C 29/00
[52] U.S. Cl. .................. 371/10; 307/465; 364/716; 371/20
[58] Field of Search .......... 371/10, 20; 364/716; 340/166 R; 307/465

[56] References Cited

U.S. PATENT DOCUMENTS

| | | | |
|---|---|---|---|
| 3,313,926 | 4/1967 | Minnick | 364/716 |
| 3,781,826 | 12/1973 | Beausoleil | 371/10 |
| 3,958,110 | 5/1976 | Hong et al. | 371/15 |
| 3,987,286 | 10/1976 | Muehldorf | 364/716 |
| 4,047,163 | 9/1977 | Choate et al. | 371/10 |
| 4,177,452 | 12/1979 | Balasubramanian et al. | 340/166 R |

OTHER PUBLICATIONS

Tanaka et al., Rewritable Programmable Logic Array of Current Mode Logic, IEEE Trans. on Computers, vol. C-30, No. 3, Mar. 1981, pp. 229-234.
Patent Abstracts of Japan, Band 4, Nr. 32, Mar. 19, 1980, JP-A-55-5542.
Patent Abstracts of Japan, Band 4, Nr. 36, Mar. 26, 1980, JP-A-55-8135.
Logue et al., Programmable Logic Array Error Detection & Error Correction, IBM Tech. Discl. Bulletin, vol. 19, No. 2, Jul. 1976, pp. 588-590.
Lipp, Array Logic, Second Euromicro Symposium on: Microprocessing & Microprogramming, Oct. 12-14, 1976, Venice, pp. 57-64.

*Primary Examiner*—Charles E. Atkinson
*Attorney, Agent, or Firm*—W. S. Robertson

[57] ABSTRACT

An apparatus and a method to automatically locate defects and to automatically insert and personalize dummy lines in a PLA having latches controlling the cross points of the AND and OR array. Upon occurrence of an error in the PLA, a check signal is generated which interrupts normal operation of the PLA and which initiates a test procedure. The cross point latches are automatically loaded with test patterns and the output of the PLA is analyzed to locate the defective part, for example, a damaged cross point transistor, short circuited or open line. The dummy lines are repersonalized automatically to replace lines which are defective themselves or which are connected to defective crosspoints.

14 Claims, 13 Drawing Figures

| PL | STUCK AT | TRANSISTOR T |
|---|---|---|
| GND | 0 | SHORT-CIRCUIT |
| ⊕ | 1 | INTERRUPTION |

| IN | LU | T | PL |
|---|---|---|---|
| 0 | 0 | OPEN | ⊕ |
| 0 | 1 | COND. | GND |
| 1 | 0 | OPEN | ⊕ |
| 1 | 1 | OPEN | ⊕ |

FIG. 4B

| AL | STUCK AT | TRANSISTOR T |
|---|---|---|
| ⊕ | 0 | INTERRUPTION |
| GND | 1 | SHORT-CIRCUIT |

FIG. 4C

| PL | LO | T | A |
|---|---|---|---|
| 0 | 0 | OPEN | ⊕ |
| 0 | 1 | OPEN | ⊕ |
| 1 | 0 | OPEN | ⊕ |
| 1 | 1 | COND | GND |

PROGRAMMABLE LOGIC ARRAY WITH SELF CORRECTION OF FAULTS

BACKGROUND OF THE INVENTION

1. Field of the Invention

The invention concerns a programmable logic array (PLA) and, in particular, the testing and loading of a PLA made up of an AND array and an OR array and in which the cross points in the arrays are controlled by storage flip-flop circuits.

Signals corresponding to a number of binary variables are applied to the input of such a PLA, and, depending upon the programmed activation of the cross points in the two arrays, output signals are received on particular output lines (function lines). A preferred application of such a PLA may be its use as a function control in a data processing system. For this purpose, the binary operation signals of an instruction are applied to the input of the PLA, and the data flow is controlled by means of the output signals on particular function lines.

Large-scale integration (LSI) permits relatively large PLAs together with the storage flip-flop circuits to be realized on one chip. As a result, the output lines of the AND array, which simultaneously form the input lines to the OR array and which are referred to as "product lines", are no longer accessible from the outside. This makes the testing of a PLA far more difficult. Such testing may be effected during or after completion of manufacture or during the operation of the PLA in a data processing system. In such a test, the object is to determine whether a line or a transistor at the cross point of a matrix has become stuck at a single logic level.

A line may be, for example, short-circuited to ground or to the supply voltage. The line may be interrupted, and in most cases an interrupted line assumes one of these potentials. If the nodes of the arrays, i.e., the means existing at a cross point, comprise a tranistor connected to one or both lines of the cross point, such a transistor may be either interrupted or short-circuited in the case of a fault, thus causing the line connected to it to assume one of the two supply potentials.

Apart from a few exceptions, it is not possible to test a PLA during its operations in a data processing system. So far, testing has been effected before installation of the PLA in the data processing system by applying special test signals and comparing the output signals with known desired values or testing after installation has been made by interrupting the normal operation and then using a diagnostic routine which also applies test patterns to the input of the PLA.

2. The Prior Art

With regard to prior art, attention is drawn, for example, to U.S. Pat. No. 3,958,110 of Se J. Hong and Daniel L. Ostapko and to their theoretical treatise in "Conference on Fault-Tolerant Computing", FTCS-8, Toulouse, June 21 to 23, 1978, pp. 83 to 89. These known arrangements permit testing the PLA only when normal operation has been interrupted. Apart from this, these known methods are not suitable for a PLA with storage flip-flop circuits in the cross points, as they do not utilize the possibility of dynamic personalization characteristic of such a PLA. The complete testing of the PLA rather requires the application of a very great number of test signal combinations and thus a long test period.

U.S. Pat. No. 3,987,286 of Eugen I. Muehldorf teaches a logic arrangement consisting of two series-connected arrays. The cross points of one of the arrays may be personalized by loadable flip-flop circuits, while the array matrix is permanently personalized. For testing, all flip-flop circuits of an array may be connected in the form of a single shift register, through which a test pattern is shifted.

A PLA with transistors at the cross points is described in the IBM Technical Disclosure Bulletin, July 1976, pp. 588 to 590. The base of each of the transistors is connected to the input line, and the emitter of each of the transistors is connected to the output line (referred to as word line). For each word line there is a further transistor which becomes conductive when a cross point transistor connected to the word line is short-circuited between its base and emitter or emitter and collector. This arrangement permits error correction insofar as further dummy lines are provided for the word lines and a further dummy output line is provided for the output lines of the OR array. In these output lines, a random binary pattern may be stored, as the cross point between the dummy line and the PLA line connected thereto is controlled by one storage element. The storage elements in the dummy lines are combined in the form of a shift register. Thus, this known arrangement only permits detecting very specific errors, i.e., whether a transistor has become struck in its conductive state. As the cross points in the arrays of this PLA, which realize the desired binary functions, are not provided with storage elements, this arrangement cannot utilize the advantages of dynamically personalizing a PLA with storage elements at the cross points. Therefore, this known arrangement is not suitable for systematically and completely testing the PLA. Lipp, "Array Logic" in "Second Euromicro Symposium on Microprocessing and Microprogramming", Oct. 12 to 14, 1976, Venice, pp. 57 to 64, proposes in FIG. 2 the use of storage elements for controlling a cross point in a PLA.

SUMMARY OF THE INVENTION

An object of this invention is to provide a programmable logic array with storage elements at the cross points that permit automatically testing and then correcting an error detected during such testing, as well as automatically and dynamically personallizing the PLA within a far shorter time than was previously possible.

The invention has the advantage that it permits localizing and correcting an error in the PLA during its operation in a data processing system, since the whole test and load process requires only a relatively short time. This is achieved by fully utilizing the advantages inherent in the use of storage flip-flop circuits at the cross points. The novel design of the PLA, which is marked by the general use of storage flip-flop circuits both for the dummy lines and the remaining lines of the PLA, as well as by special set and reset lines, by means of which, for example, the OR array can also be set or reset columnwise, considerably shortens the test method and permits errors to be localized more accurately. A single interrupted transistor, for example, may be localized by means of its row and column coordinates. The advantages offered by the invention are also obtainable in those cases where the product lines connecting the two arrays and the storage flip-flop circuits are not individually accessible from the outside. As the arrangement in accordance with the invention is used only for a short time in each case, it may be provided for many programmable logic arrays in common. Automatic testing and automatic error correction eliminate personnel for repairing the system. As loading and testing require only a short time, these operations may be effected prior to switching on the system in the morning. The whole test and load process, for example, takes only 1 msec., so that the data processing system, rather than having to be switched off in the case of an error occurring during its operation, need only be stopped for one millisecond.

The invention will be described in detail below by means of the accompanying drawings showing one embodiment.

DETAILED DESCRIPTION

Figure 1:
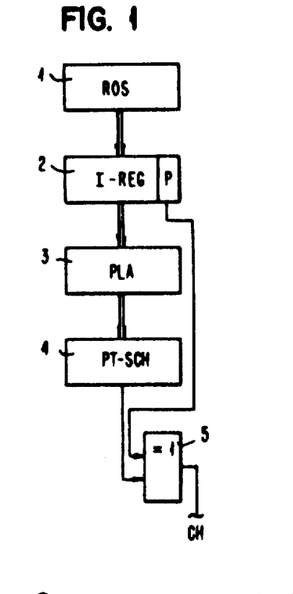
FIG. 1 shows the use of a programmable logic array (PLA) as a function control in a data processing system and the generation of an error signal.

Introduction—FIG. 1

As an example of using a programmable logic array (PLA), FIG. 1 shows the function control of a microprogrammed data processing system. A read-only storage 1 stores the micro instructions which are loaded into an instruction register 2. In each micro instruction a parity bit P is stored which is also loaded into register 2. The coded operation signals of the micro instructions are fed to the input lines of the PLA 3. At the output of the array 3 function lines are provided which are connected to particular control inputs in the data processing system. Depending upon the micro instruction, signals are received on particular function lines, which in a manner not shown here are used to control the system. The function lines are connected to the inputs of a parity circuit 4 generating a further parity bit from the binary 1-values received, which in the EXCLUSIVE-OR gate 5 is compared with the parity bit in the respective micro instruction. Normally, the two bits match. If they do not, an error signal CH is generated at the output of the EXCLUSIVE-OR gate 5, which in most cases is indicative of the programmable logic array 3 operating erroneously, as the remaining means are mostly far less errorprone and can also be tested in an entirely different manner. Thus, with the aid of the means shown in FIG. 1, it can be tested whether the PLA 3 operates non-erroneously.

Figure 2:
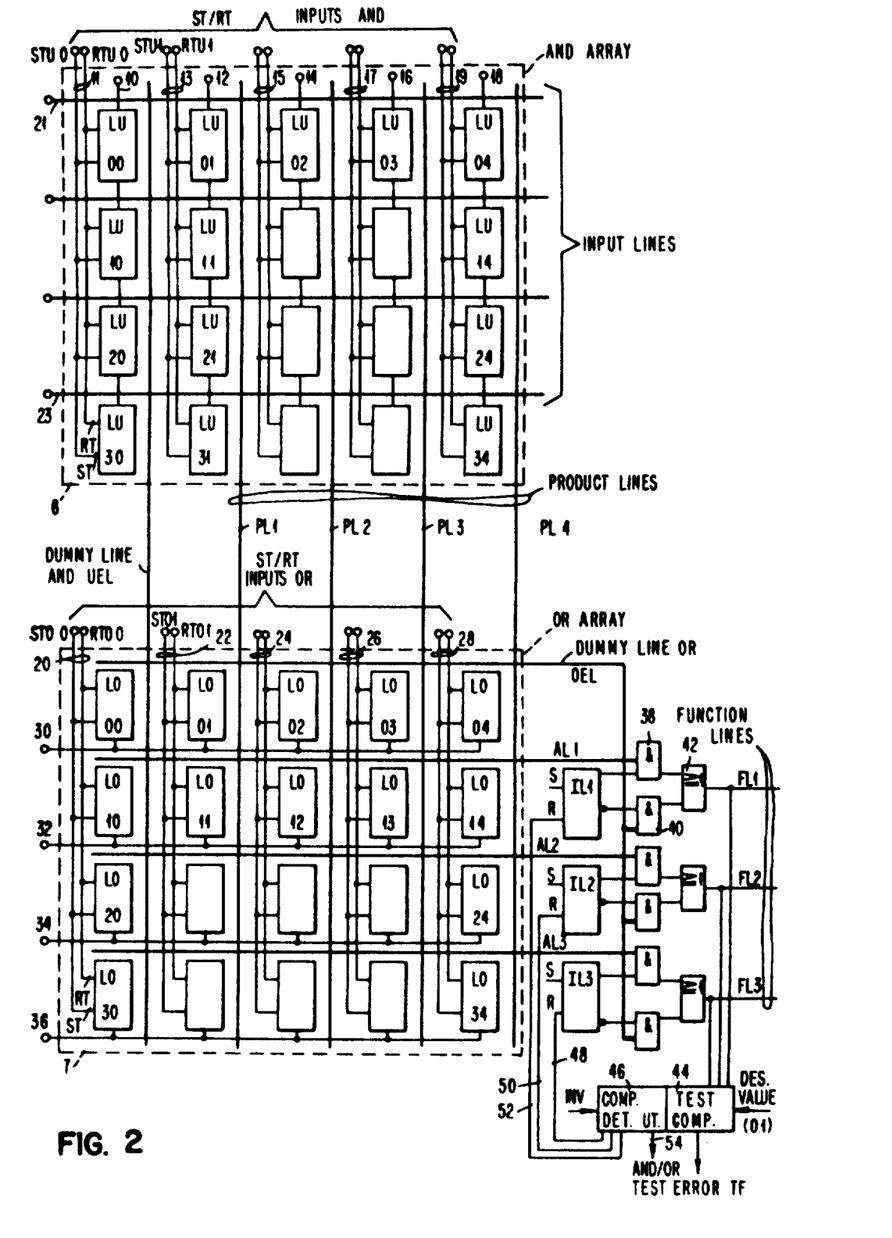
FIG. 2 shows a PLA in accordance with the present invention.

The PLA of FIG. 2

The design of a programmable logic array in accordance with the present invention is shown in greater detail in FIG. 2. The illustrated PLA has a number of input lines which simultaneously form the row lines of an AND array 6. The output lines of the array 6 correspond to the columns of the array at the cross points of the row and column lines. There is, for example, one transistor, as will be explained further on by means of FIGS. 3 and 4. Along the columns of the array shift registers are arranged which have as many stages as there are input or row lines. Each shift register stage controls its associated transistor. Thus, the logic state of the AND array is defined by the pattern stored in the shift registers.

Each shift register has two control lines STU and RTU, by means of which all stages of the shift register can either be set (ST) or reset (RT). FIG. 2, top-most part, shows the inputs to these control lines common to all stages of a shift register. The inputs to the respective shift registers are designated as 10, 12, 14, 16 and 18 in FIG. 2. If the left-most column of the AND array 6 is designated as the zeroth column and the top-most row line of the array as the zeroth row or line, the stages of the individual shift registers, which are arranged in the form of an array, can be designated as LU np in accordance with the indices for row line (n) and column (p). The shift register belonging to the zeroth column thus comprises the stages LU 00 to LU 30.

The output lines of the AND array 6 corresponding to the columns 1 to 4 are referred to as product lines PL1 to PL4. These lines form the inputs of an OR array 7, on whose output lines AL1, AL2 and AL3 the output signals of the PLA are received. Analogously to array 6, transistors are also provided at the cross points of the OR array 7. As in array 6, these transistors are controlled by stages of shift registers. In contrast to AND array 6 in which the shift registers are formed along columns, the shift registers of the OR array 7 are arranged along the row lines. Thus, the shift register associated with the zeroth row line of the OR array 7 comprises the stages LO 00 to LO 04. The input signal for this shift register is applied to terminal 30. The shift registers associated with the further lines 1 to 3 of the OR array 7 can be loaded at the terminals 32 to 36. By means of a common line STO/RTO, the shift register stages belonging to a particular column of the OR array 7 can be either set (ST) or reset (RT) (lines 20, 22, 24, 26, 28). Notice that in the AND array 6, all stages of a particular shift register are set or reset together, but in the OR array 7 only stages of the same order (column) of the various shift registers are set or reset together. In addition to the product lines PL1 to PL4, an AND dummy line UEL forming the zeroth column of arrays 6 and 7 is provided in accordance with the invention. Also in accordance with the invention, there is an OR dummy line OEL which is associated with the zeroth line of the array 7. The former line is provided in addition to the output lines AL1 to AL3 of the OR array 7, which are arranged in the form of an array line.

In the case of a single error in the PLA, the two dummy lines serve to switch off the affected cross points, replacing them by dummy crosspoints. The logic arrangement located at the output of the OR array 7, which will be described further on, permits replacing one of the output lines AL1 to AL3 by the dummy line OEL. For this purpose, the respective flip-flop circuit IL1 to IL3 is reset, so that, for example, for output line AL1, the AND gate 38 is switched off and the AND gate 40 is switched on. Thus, on function line FL1 a signal corresponding to the signal on the dummy line OEL is received via the OR gate 42. All flip-flop circuits IL1 to IL3 are set when the PLA is loaded. The function lines FL1 to FL3 are analogous to the function lines shown at the output of the PLA 3 in FIG. 1.

The Cross Point Circuits

In a PLA of the kind shown in FIG. 2 four types of errors may be distinguished. The transistor of a cross point can no longer be switched on or off, and a line is either interrupted or short-circuited. In the following description these states are defined in such a manner that the respective transistor or line is stuck at "0" or "1".

For explaining more clearly the types of errors encountered and the test method for detecting them, two possible implementations of the cross points of the AND array 6 and the OR array 7 will be described below.

Figure 3A:
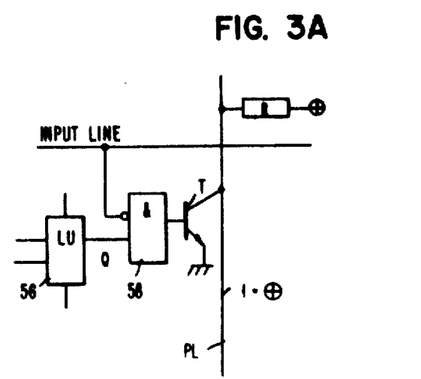
FIGS. 3A, 3B, 3C, and 4A, 4B, and 4C show cross points of the arrays of the PLA.
Figure 3B:
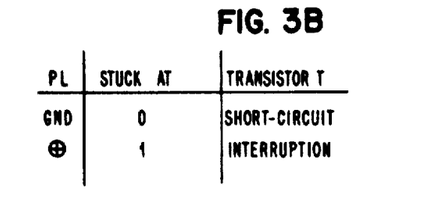
Figure 3C:
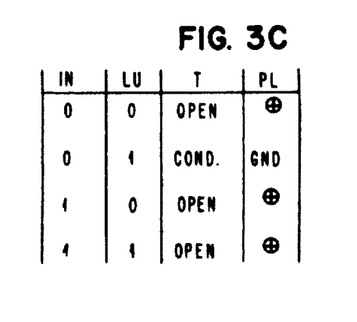

FIG. 3A shows a cross point for the AND array 6, which comprises a flip-flop circuit LU (reference number 56), a logic element 58, and a transistor T. By means of the cross points in matrix 6, for a particular column, an AND condition is to be realized for particular logic values on the input lines. If a signal is to be produced, for example, on product line PL4 when a 1 logic level signal is applied both to the input line 21 and the input line 23, the two flip-flop circuits LU 04 and LU 34 have to be set in the respective column. When the AND function is obtained, the transistor controlled by the flip-flop circuit LU 04 as well as the transistor controlled by the flip-flop circuit LU 34 not becoming conductive, thus causing the product line PL4 to assume plus potential. This is only possible if all the remaining transistors of this column are already non-conductive. If only one of the remaining transistors were conductive, the product line PL4 could not assume plus potential. In accordance with this, the conditions shown in FIG. 3C are obtained for the logic signals at the input line as well as the logic state of the flip-flop circuit LU. Thus, the transistors T must be open (non-conductive) in any case if the flip-flop circuit is not set (first and third line). If the flip-flop circuit is set, transistor T must become conductive when a binary zero is available at the input row line and it must be opened when a binary one is available at the input (second and fourth line, respectively, of FIG. 3C). If either transistor T or line PL has become stuck, the states shown in FIG. 3B are obtained in accordance with the table in FIG. 3C.

The logic conditions shown in FIG. 3C can be realized, for example, by means of the circuit of a cross point shown in FIG. 3A. In this circuit the collector of the npn transistor T is connected to the product line PL, while the emitter of said transistor is connected to ground (GND). The input line is connected to an inverting input of an AND gate 58, while the other input of said AND gate is connected to the true output Q of the flip-flop circuit LU 56. The output of the AND gate 58 addresses the base of the transistor T. If both input conditions of the AND gate 58 are fulfilled, the output rises, i.e., it becomes more positive, opening the transistor T.

Figure 4A:
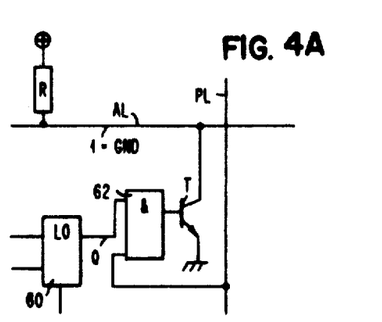

FIG. 4A shows one possible realization for a cross point of the OR array 7. The OR function is fulfilled by one of the transistors T connected to a particular output line AL becoming conductive. Thus, the ON-state of the output line AL is given by the zero potential (GND) (while the binary 1-value of a product line PL is given by the plus potential). The logic conditions for a cross point of the OR array 7 are shown in FIG. 4C. In accordance with this table, transistor T must become conductive if the flip-flop circuit LO is set and a 1-value is received on the product line PL. If the flip-flop circuit is not set (lines 1 and 3 in FIG. 4C), the transistor must continue to be open, as only this ensures that the transistors T belonging to the set flip-flop circuits are capable of realizing the OR function. In accordance with the potential conditions specified, the table for erroneous output lines AL or erroneous transistors T is obtained in accordance with FIG. 4B.

In accordance with the invention, the occurrence of a signal indicating an error in the PLA, such as signal CH in FIG. 1, causes a test routine to be initiated. This routine permits identifying the erroneous or faulty transistor or line and permits restoring the operation of the PLA by means of the dummy line UEL or the dummy line OEL.

The Test Method

The test method described below concerns a PLA with n input lines to the AND array, with p columns and m output lines of the OR array. The columns contain a dummy line UEL and p-1 product lines. The output lines of the OR array comprise an OR dummy line OEL and m-1 function lines. In the example shown in FIG. 2, four input lines, five columns and four output lines are provided. The corresponding numbering ranges from 0 to n-1, 0 to p-1 and 0 to m-1.

TABLE I

| Phase | Step | Input Lines | AND array Cols. 0 1 . . . p − 1 | OR array Cols. 0 1 . . . p − 1 | Type L, T | Error Array | Stuck at | Output signal of function Line with error | Output signal of function Line without error |
|---|---|---|---|---|---|---|---|---|---|
| 1 | S1 | X | fully reset | fully reset | L, T | OR | 1 | 0 . . . 010 . . . 0 | 0 . . . 0 |
| 2 | S2 | X | fully reset | fully reset | L | OR | 0 | 1 . . . 101 . . . 1 | 1 . . . 1 |
|  | 0 |  |  | st rt . . . rt |  |  |  |  |  |
|  | 1 |  |  | rt st . . . rt |  |  |  |  |  |
| 3 | . | X | fully reset | . . | L, T | AND | 0 | 0 . . . 0 | 1 . . . 1 |
|  | . |  |  | . | T | OR | 0 | 1 . . . 101 . . . 1 | 1 . . . 1 |
|  | p − 1 |  |  | rt rt . . . st |  |  |  |  |  |
|  | p |  | st rt . . . rt | st rt . . . rt |  |  |  |  |  |
|  | p + 1 |  | rt st . . . rt | rt st . . . |  |  |  |  |  |
|  | . |  | . . | . . |  |  |  |  |  |
| 4 | . | O | . . | . . | L | AND | 1 | 1 . . . 1 | 0 . . . 0 |
|  | . |  | . . | . . |  |  |  |  |  |
|  | 2p − 1 |  | rt . . . st | rt . . . st |  |  |  |  |  |

TABLE II

| | | All input lines 0 | | | |
|---|---|---|---|---|---|
| Phase | Step | AND Array Cols. 0 1 ... p − 1 | OR Array Cols. 0 1 ... p − 1 | Error T AND Stuck at 1 | No error |
| 5 | 2p | st rt ... rt<br>rt .<br>. .<br>rt . | st rt ... rt | 1 ... 1 | 0 ... 0 |
| | 2p + 1 | rt ... rt<br>st .<br>rt . | | | |
| | | . .<br>rt ... rt | | | |
| | 2p + n − 1 | rt ... rt<br>. .<br>rt | | | |
| 6 | 2p + n | st rt ... rt<br>rt st rt . rt<br>. rt .<br>. . . | rt st rt . rt | 1 ... 1 | 0 ... 0 |
| | 2p + 2n − 1 | rt rt ... rt<br>rt rt ... rt<br>. . .<br>. rt .<br>rt st rt . rt | | | |
| . | . | . | . | 1 ... 1 | 0 ... 0 |
| 5 + p − 1 | 2p + n(p − 1) | rt ... rt st<br>. rt<br>. . | rt rt ... rt st | 1 ... 1 | 0 ... 0 |
| | 2p + n . p − 1 | rt ... rt<br>rt ... rt<br>. .<br>. rt<br>rt ... rt st | | | |

The test method shown in tables I and II (pages 12 and 13) may be used both during the production of the PLA and during its operation in a data processing system. For clarity, the test method in the tables is subdivided into individual phases. With the exception of the first two phases 1 and 2, each phase consists of a plurality of steps. The first column of the table (left-most part) indicates the phase and the second column indicates the steps. The remaining columns of table I show the states of the input lines, the individual columns of the AND array, as well as the OR array. The next column contains information on the kind of error encountered, while the last column, which is divided into two parts, indicates which signals can be expected on the function lines if the PLA has one or no error. The setting and resetting of an array applies, of course, to its flip-flop circuits.

In step S1, the signals on the input lines are insignificant (character X). The whole AND array is reset, i.e., all transistors T are blocked, and all lines PL are at plus potential. The OR array is also completely reset, i.e., also in this case all transistors T are blocked, and all output lines AL are at plus potential which in the latter case, however, corresponds to the binary 0-value. Thus, an 0-signal is expected on all function lines FL1 to FL3 in FIG. 2. If one of these signals has the 1-value, the appertaining output line AL is short-circuited to ground, i.e., it carries the binary 1-value. The same error signal is received also in those cases where one of the transistors T belonging to said output line is short-circuited to ground. Thus, in step S1 it is determined whether output line AL or a transistor connected to it is short-circuited to ground. The desired value 0 for all lines is entered into comparator 44 (FIG. 2) in step S1. The comparator 44 compares the signal on each of the lines FL with the desired value. If there is a mismatch between this desired value and the actual value on one of the function lines FL, the output of the test comparator 44 indicates a test error TF. The respective output line is directly indicated by the comparison evaluator 46 by one of the lines 48, 50, or 52, which are associated with one function line each, carrying the binary 1-value. The signal INV (see below) is not switched on in step S1. The corresponding 1-signal on one of the lines 48 to 52 resets the corresponding flip-flop circuit IL, so that the OR dummy line OEL, rather than the corresponding output line AL, is switched to the function line FL. The erroneous line of the OR array 7 is switched off in this manner. In its place, the dummy line OEL is switched on, which must, of course, be loaded with the data pertaining to the erroneous line. This will be described further on.

In phase 2, i.e., in step S2, the following conditions must be provided: The state of the input lines is insignificant, and the AND array is fully reset, and the OR array is fully set. Thus, as in step S1, all product lines carry plus potential. As a result, and because the whole OR array is set, all transistors T in the OR array are conductive, so that all output lines must be at zero potential, i.e., they must yield the binary value 1. Thus, for each function line FL, the desired value to be entered into the test comparator 44 consists of the 1-value. If the test comparator 44 detects that one of the function lines FL carries the 0-value, this indicates that the corresponding output line AL is erroneous. The signal INV is present at the input of the comparison evaluator 46, so that the individual 0-value indicating the error is inverted to form a binary 1-value, resetting the respective flip-flop circuit IL, as previously described. These flip-flop circuits IL must, of course be set in each case before operating the PLA. The erroneous output line AL, which has become stuck at 0 and thus has a positive potential, is replaced by the dummy line OEL.

This is followed by phase 3, during which it is to be detected whether a line or a transistor of the AND array is stuck at 0, this being indicated by the corresponding product line PL being at zero potential. In phase 3, the logic state of the input lines does not matter either. The AND array is fully reset, i.e., all product lines PL are to be at plus potential. In contrast to the two preceding single-step phases, phase 3 comprises as many steps as there are column lines. If there ae p column lines, the first column, i.e., the dummy line column, is designated as 0, while the last column, i.e., the column belonging to product line PL4 in FIG. 2, is designated as p-1. It may be seen from Table I that during the begin step of phase 3, i.e., in step 0, the column 0 of the OR array is set, while all other columns are reset. If, as has to be expected in a no-error case, line UE1 is at plus potential, i.e., if it carries the binary value 1, all function lines must be 1, since the first column of the OR array 7 is set. Thus, the desired value to be entered into the test comparator is the 1-value. If the line UE1 which belongs to the zeroth column is stuck at 0, i.e., if it is short-circuited to ground, none of the output lines will carry a signal, i.e., zero potential, and the error signal (only zeroes) indicated in table I for phase 3 is obtained. The same error signal is also received when one of the transistors T (FIG. 3A) connected to said column line is short-circuited to ground, since such a transistor will pull the respective column line down to zero potential. In step 1, the column line belonging to the first column (PL1, FIG. 2) is tested for a short-circuit to ground by setting in the OR array flip-flop circuits L0, 01, L0 11, etc., belonging to this column and resetting all other columns of the OR array. In the further steps 2 to p−1 the remaining column lines are tested.

In phase 3, it is possible to determine by means of the same logic states of the AND and the OR array whether a transistor of the respective column set is stuck at 0 in the OR array, i.e., whether it is interrupted. As such a transistor is not made conductive by the set signal of the appertaining flip-flop circuit L0 either, an 0-signal which is detected by the test comparator 44 appears on the respective function line. After this single 0-signal has been inverted to form a binary 1, the respective output line AL including the defective transistor is deactivated by evaluator 46.

In phase 4, it is tested whether a column line is stuck at 1, i.e., whether it is always at plus potential. For this purpose, a 0-signal is applied to all input lines, and one column each of the AND array as well as the corresponding column of the OR array are set. In step p, for example, the column 0 of the AND array and the column 0 of the OR array are set. As a 0-signal is present on all input lines, all transistors of column 0 of the AND array 6 are made conductive (line 2 in FIG. 3C) and the column line UEL is connected to ground, i.e., it has the binary 0-value. As all flip-flop circuits belonging to this column are set in the OR array, all transistors of this column are open and all output lines AL of the OR array are at plus potential (0-value, see second line in FIG. 4C). If the respective column line is stuck at 1, i.e., if it is at plus potential, having the binary 1-value, a 1-signal is received on all function lines FL, and the comparator 44 indicates a test error.

The test method in accordance with the invention can also be used to determine whether a single transistor in the AND array 6 is stuck 1t, 1, i.e., whether it is interrupted. While a short-circuited transistor is not identifiable, because a short-circuited line produces the same error signal, a single interrupted transistor can be readily detected both in the AND and the OR array, as the line connected to such an interrupted transistor can still be influenced by other transistors connected to this line. In the subsequent phases 5 to 5+p−1 only one flip-flop circuit LU is set in the AND array, while all other flip-flop circuits continue in their reset state. During this process, the set state ripples in n steps from the top-most flip-flop circuit of a column to the bottom-most flip-flop circuit, since there are n input lines. After such n steps, the process continues with the next column, and the set states also ripples from the first to the last flip-flop circuit of the respective column. During such rippling of the set state of a single flip-flop circuit through a particular column, the corresponding column in the OR array is set, while all other columns in the OR array are reset. As can be seen from table II, the first step of phase 5 is designated as 2p, as the steps from the beginning of phase 3 are consecutively numbered, and phases 3 and 4 comprise p steps each. Thus, in step 2p the top-most flip-flop circuit of the zenith column, i.e., flip-flop circuit LU 00, is set, while the remaining AND array is reset. In the OR array 7 the first column is set, while all other columns are reset. During the whole test process in accordance with table II, the PLA 0-signals are applied to all inputs. Thus, the transistor belonging to flip-flop circuit LU 00 is conductive in step 2p (line 2 in FIG. 3C), and the zeroth column line UEL is at zero potential. As a result, none of the transistors of zeroth column in the OR array is switched to its conductive state. As the flip-flop circuits L0 belonging to all other columns of the OR array are reset, the remaining transistors of the OR array are also open, so that only binary 0-values are received at the output of the OR array (last column of table II).

If transistor T belonging to the set flip-flop circuit LU 00 is interrupted, i.e., if it is stuck in the binary 1-state, the column line UEL is not switched to zero potential, and all output lines of the OR array are switched to the binary 1-value, since all flip-flop circuits of the OR array belonging to the zeroth column are set. If only ones (penultimate column) are received at the output of the PLA, this indicates that the respective transistor set in the AND array is defective. It is stuck at 1, i.e., interrupted.

In the subsequent steps 2p+1 to 2p+n−1 the set state of the individual flip-flop circuit LU set ripples through all n lines of the zeroth column, a comparison with the desired value "only zeroes" being made by the test comparator 44 at the PLA after each ripple of the 1-state. After all transistors of the zeroth column of the AND array 6 have been tested, the first flip-flop circuit LU 01 of the first column is set, and subsequently the first column is tested in the same manner as the zeroth column. The desired value expected at the output of the PLA as well as the value occurring on the function lines in the case of an error remains the same for the whole table II. After the first column of the PLA has been tested, the second column is tested in phase 6. Thus, testing for a transistor stuck at 1 in the AND array necessitates as many phases as there are columns, i.e, p phases. In each phase the flip-flop circuit belonging to a line is set in a test step, so that in a phase there are as many steps as there are lines, i.e., n steps. Thus, the whole process in accordance with table II necessitates n.p steps, so that the last step is designated as 2p+np−1 and the last phase as 5+p−1. To permit detecting a single transistor stuck at 1 in the AND array, an unduly great number of test steps are required. Therefore, this part of the test process in accordance with table II will be executed only after, say, the production of the PLA if, for example, an erroneous function of the production means is to be detected. During the operation of the PLA, phase 4 will suffice in most cases, as the error detected in it also includes an AND array transistor set to 1 (see desired value and error signal).

Figure 4B:
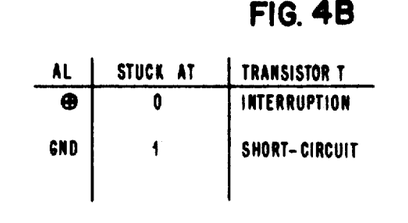
Figure 4C:
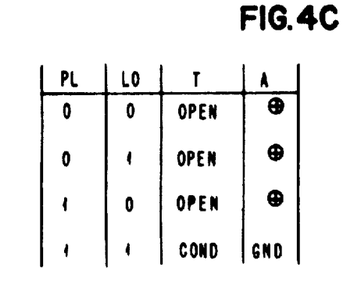

The above-described test method concerns realizations of cross points in accordance with FIGS. 3 and 4. If other realizations are chosen, it may be advantageous in particular circumstances to reset certain columns in the arrays, while all other columns remain set. It may also be advantageous to have a binary 0-state ripple through all flip-flop circuits, while all other flip-flop circuits are set. Depending upon the cross point used, individual ones of the phases described in connection with tables I and II may be superfluous, while additional phases of the kind referred to above may have to be implemented. In principle, there are maximum possibilities if each of the two arrays can be both fully set and fully reset, if whole columns can be set as well as reset, and if individual flip-flop circuits can be set as well as reset. In addition, it is expedient to test the lines of the PLA first and then individual transistors, starting with the OR array 7 and continuing with the AND array 6. As from phase 4 onwards all input lines must be 0, it is advantageous to apply 0-signals to the inputs also in the first three phases.

Figure 5:
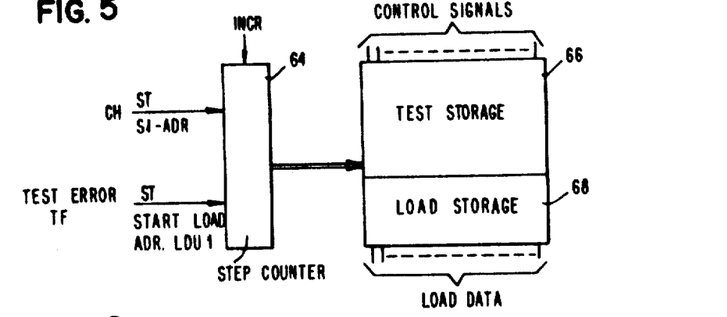
FIG. 5 is a schematic of the means used to generate control and load signals.

As previously mentioned, data processing is stopped for a short time upon the occurrence of an error signal CH (FIG. 1), and the test method described is initiated. As the test mwethod destroys the data stored in the flip-flop circuits of the PLA, the latter has to be reloaded after completion of the test process. FIG. 5 is a schematic of the means required for implementing the test method and the subsequent load process. For defining the steps of the test method and the load process, a step counter 64 is provided with is activated upon the occurrence of an error signal CH. For this purpose, the counter 64, is caused to assume the state provided for step S1 (Table I). The output signals of the counter 64 address a test storage 66 and a load storage 68 which may be designed as read-only storages. In each step during the test process a word is read from the test storage, whose individual bits represent the control signals for implementing the test process. If an error appears during the test process, the step counter 64 is stopped and its count is stored. By means of this count and the control signals obtained thereby from the test storage 66 the error encountered may be automatically determined. Subsequently, the test error signal causes the begin address of the load process to be loaded into the step counter 64. During the load process, the data to be stored in the latch circuits of the PLA are received from the load storage 68. During the load process, control signals necessary for the implementation of the load process are obtained at the output of the test storage 66.

If the test process, rather than being initiated by an error, is executed, for example, before operating the PLA, the load process takes place after the last step of the test process.

The maximum time required for executing the test process is obtained by multiplying the number of steps required by the step time. In accordance with Table I, $(2+2p)$ steps are required, whereas according to Table II, n.p steps are necessary, so that there is a total number of $(2+2p+np)$ steps. At a duration of 20 nsec. for each step and at practical values of $p=200$ and $n=100$, the test process requires 408,040 nsec. i.e., about 0.4 milliseconds. If only the steps in accordance with Table I are executed, the time required is only 402.20 nsec., i.e. about 8 microseconds.

The control signals and means necessary for implementing the method will be described in detail below by means of Tables III and IV as well as by means of FIG. 6.

The following control signals are required for executing the test process:

| | |
|---|---|
| - TEST: | This signal is applied during the whole test process. Its significance will be described further on. |
| - INV: | This signal is applied to the comparison evaluator 46 (FIG. 2), indicating whether the signals received on lines 48 to 52 are to be inverted. It is reiterated that signals on these lines are received only in the case of an error. The signals are effective only if the error concerns the OR array 7, which is indicated by signal 54 from the comparison evaluator 46. The signal 54 is dependent upon whether the test comparator 44 detects the same error for all function lines (in such a case the error is in the AND array, see, for example, phase 4 and subsequent phases) or whether the result of the comparison for one function line differs from that of the remaining lines (in such a case the error is in the OR array, see, for example, phases 1 and 2). The signal INV is only important during the first three phases of the test process and may subsequently assume any random value (for example, "1"). |
| - DESIRED: | This signal indicates the desired value, by means of which the comparator 44 is to compare the output signals of the function lines. |
| - FS COLUMN AND: | This signal is used in the phases or steps, during which a new column of the AND array is to be tested. |
| - FS COLUMN OR: | This signal indicates when a new column of the OR array is to be tested. In phase 4 the two preceding ripple signals are used. In the same phase, the column next in line of the AND and the OR array is tested after each step. |
| - FS BIT: | This signal is used in the test process in accordance with table II. In each step of this process another flip-flop circuit of the AND array 6 is set. During this process, the set state of an individual flip-flop circuit ripples through a column. Then a binary 1 is entered into the shift register of the next column. |
| - ST OR: | This signal sets all flip-flop circuits of the OR array. |
| - RT AND: | This signal resets all flip-flop circuits of the AND array. |
| - RT OR: | This signal resets all flip-flop circuits of the OR array. |
| - RT p-CTR: | This signal resets counter 72 shown in FIG. 6. This counter serves to define the respective column tested. |
| - INC-p: | This signal increments the counter 72 by one unit. |

The subsequent Table III clearly shows the use of these control signals during the individual steps of the test sequence. The effect these control signals have will be explained by means of FIGS. 6 to 9.

"store m-value" is applied to said register. From register 84 this m-value can be loaded into counter 86 if the

TABLE III

| Phase | Step | Test | INV | DESIRED | Test Sequence FS COLUMN AND | FS COLUMN OR | FS BIT | ST OR | RT AND | RT OR | RT p-CTR | INC-p |
|---|---|---|---|---|---|---|---|---|---|---|---|---|
| 1 | S1 | 1 | 0 | 0 | 0 | 0 | 0 | 0 | 1 | 1 | 0 | 0 |
| 2 | S2 | 1 | 1 | 1 | 0 | 0 | 0 | 1 | 1 | 0 | 0 | 0 |
|   | 0  | 1 | 1 | 1 | 0 | 1 | 0 | 0 | 1 | 0 | 1 | 0 |
|   | 1  | 1 | 1 | 1 | 0 | 1 | 0 | 0 | 1 | 0 | 0 | 1 |
| 3 | . | . | . | . | . |   |   |   | . | . | . | . |
|   | . | . | . | . | . |   |   |   | . | . | . | . |
|   | p − 1 | 1 | 1 | 1 | 0 | 1 | 0 | 0 | 1 | 0 | 0 | 1 |
|   | p | 1 | 1 | 0 | 1 | 1 | 0 | 0 | 1 | 1 | 0 | 1 |
|   | p + 1 | 1 | 1 | 0 | 1 | 1 | 0 | 0 | 0 | 0 | 0 | 1 |
| 4 | . | . | . | . | . |   |   |   |   |   |   |   |
|   | 2p − 1 | 1 | 1 | 0 | 1 | 1 | 0 | 0 | 0 | 0 | 0 | 1 |
|   | 2p | 1 | 1 | 0 | 0 | 1 | 1 | 0 | 0 | 0 | 0 | 1 |
|   | 2p + 1 | 1 | 1 | 0 | 0 | 0 | 1 | 0 | 0 | 0 | 0 | 0 |
| 5 | . | . | . | . | . |   |   |   |   |   |   |   |
|   | 2p + n − 1 | 1 | 1 | 0 | 0 | 0 | 1 | 0 | 0 | 0 | 0 | 0 |
|   | 2p + n | 1 | 1 | 0 | 0 | 1 | 1 | 0 | 0 | 0 | 0 | 1 |
| 6 | . |   |   |   |   | 0 |   |   |   |   |   | 0 |
|   | . |   |   |   |   |   |   |   |   |   |   |   |
|   | 2p + 2n − 1 | 1 | 1 | 0 | 0 | 0 | 1 | 0 | 0 | 0 | 0 | 0 |
|   | . | . | . | . |   |   |   |   |   |   |   |   |
|   | 2p + n(p − 1) | 1 | 1 | 0 | 0 | 1 | 1 | 0 | 0 | 0 | 0 | 1 |
|   |   |   |   |   |   | 0 |   |   |   |   |   | 0 |
| 5 + p − 1 | . | . | . | . |   |   |   |   |   |   | . | . |
|   | 2p + n · p − 1 | 1 | 1 | 0 | 0 | 0 | 1 | 0 | 0 | 0 | 0 | 0 |

A "1" in the last table means that the signal is used during the respective step, while a "0" or a blank indicates that the signal is not used.

Figure 6:
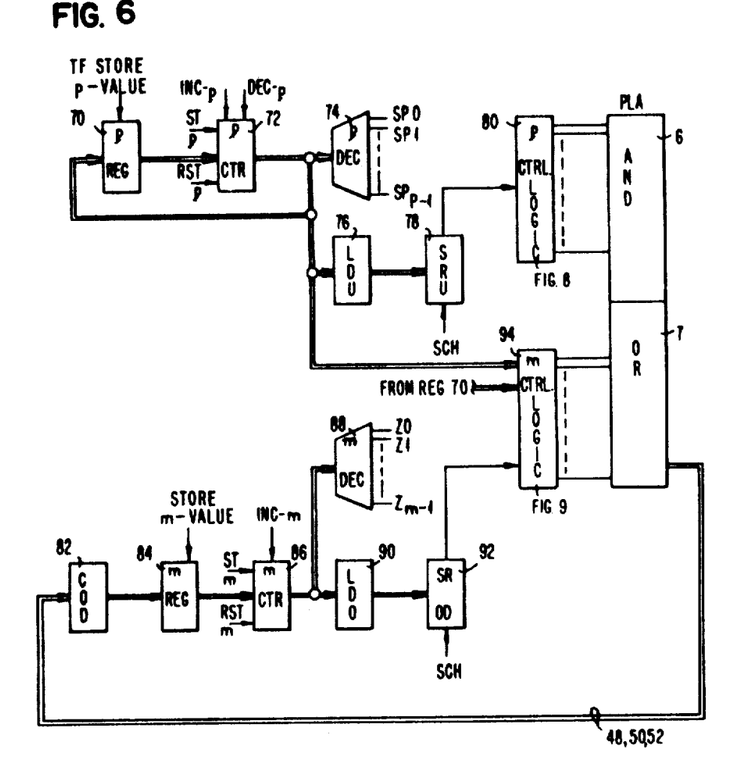
FIG. 6 shows means for testing and loading the PLA, using said control and load signals.

FIG. 6 shows means for testing and loading the PLA, which use the control signals illustrated in FIG. 5. The p-counter 72 has been previously mentioned. This counter indicates one of the columns 0 to p−1 after its count has been decoded in decoder 74. During the test process, this counter is incremented whenever the signal INC-p is applied. If a test error TF is detected during testing, the count of counter 72 is stored in p-register 70. This stored count may be loaded into the counter 72 at any time, using the signals ST-p. In addition, the counter can be reset by means of the signal RST-p and be decremented by means of the signal DEC-p. During the load process, the counter 72 addresses the load storage 76 for the AND array, whence the data of a column are loaded into the shift register 78. From this shift register, the data can be loaded, via the p-control logic 80, into the corresponding flip-flop circuits of the column indicated in the AND array 6. The control logic 80, which also receives the control signals of the test storage 66, will be described in detail below.

In addition to data on the respective column considered, loading necessitates means indicating which of the altogether m lines of the OR array 7 is currently considered. For this purpose, a counter 86 is provided. The counter 86 can be reset by the signal RST−m and be incremented by the signal INC−m.

If it is detected in test step S1 (table I) that, for example, a particular output line of the OR array 7 is erroneous, such an output line is indicated by a signal on one of the lines 48 to 52, as previously described in connection with FIG. 2. This signal is also applied to the coder 82 in FIG. 6, where it is converted into a coded representation of the respective line number and from where it can be loaded into register 84, if the control signal signal ST-m is applied. Similar to the AND array, the OR array is provided with a decoder 88 indicating in the latter case which of the lines 0 to m−1 of array 7 is being considered. In addition, a load storage 90 is provided for the OR array, the output signals of which are loaded into a shift register 92, whence they may be transferred, via an m-control logic 94, to the flip-flop circuits of the line considered in OR array 7. The logic 94 also requires signals indicating the count of counter 72, the contents of p-register 70, as well as the switched on output of decoder 74, as will be described in detail further on.

Figure 7:
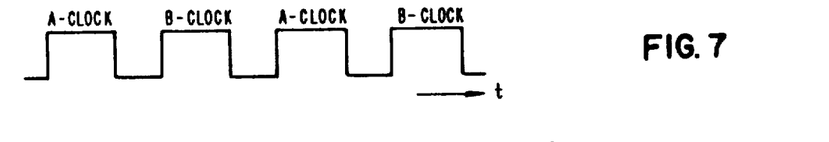
FIG. 7 shows a clock pulse train.

FIG. 7 shows a detail of the time sequence of the individual test steps. Generally, one test is effected during each step of the test process, i.e., for each count of the step counter 64 during the test process. This test mainly serves to detect the output signal of the test comparator 44. If no signal TF indicating an error is received, the step counter 64 is incremented by one unit, and a further test is effected in the next step.

As shown in table I, it is necessary in some test steps that the set state ripples from one column to the next. The approach used for this purpose may be such that in the first half of a test step the arrays are reset and that the new column is set in the second half. FIG. 7 shows such a subdivision of a test step into two time halves which are marked by a corresponding clock pulse. The first half is marked by the A-clock and the second half by the B-clock. A main clock generator, as is generally used for data processing systems, is, of course, provided for controlling the error detection and correction means described. With the aid of pulses obtained from this clock generator, the step counter 64 is incremented. During testing in accordance with table II these increment pulses INCR can also be used as shift pulses for shifting the individual bits set in the shift registers of the AND array 6. The shift pulses necessary during the loading of the PLA for loading the PLA flip-flop circuits are also derived from the pulses of the clock generator. The clock control means necessary for this purpose are known per se and need not be described here in detail.

The p-control logic 80 shown in FIG. 6 will be described in greater detail by means of FIG. 8. The logic 80 is controlled by individual control signals of the test storage 66 shown in FIG. 8 and supplies reset, set and load signals for one column each of the AND array 6.

Figure 8:
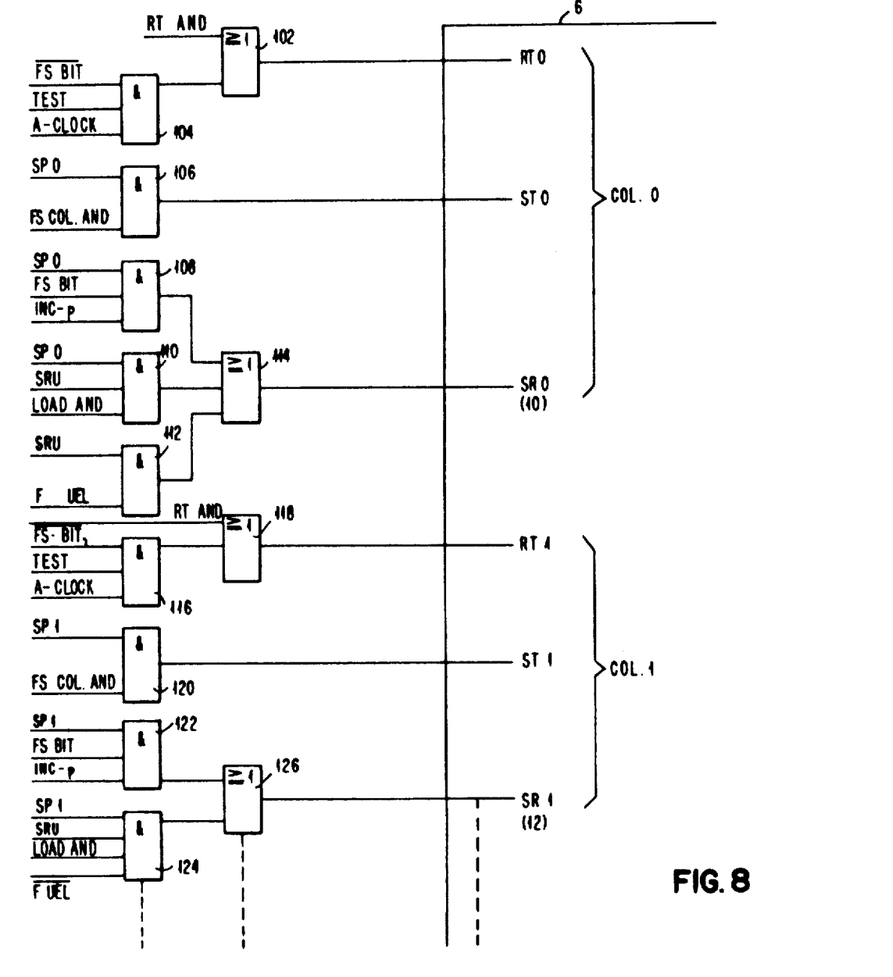
FIGS. 8 and 9 show details of the means illustrated in FIG. 6.

In FIG. 8 the generation of these signals is shown only for columns 0 and 1; columns 2 to p-1 require the same means as column 1.

Column 0 is reset by the output signal of the OR gate 102, if the signal RT AND is applied or the AND gate 104 supplies an output signal. The inputs of this AND gate are formed from the inverted signal FS BIT, the signal TEST in table III and the signal A-clock in FIG. 7. Thus, during the test steps shown in table I, the zeroth column of the AND array is reset in the first time half of each test step.

Column 0 is set if it is selected by decoder 74, i.e., if the signal SP 0 and the signal FS COLUMN AND in table III are applied, using AND gate 106. The shift register belonging to the zeroth column and consisting of the flip-flop stages LU 00 to LU 30 is loaded via input terminal 10 if a signal is received from OR gate 114 which is fed by three AND gates 108, 110 and 112. The input signals for AND gate 108 consist of the selection signal SP 0, the control signal FS BIT and the control signal INC−p. Thus, the AND gate 108 supplies an output signal whenever the set state of an individual flip-flop circuit in table II repples through all flip-flop circuits of a shift register of a particular column and the set state is to be fed into the first stage of the shift register of the next column. This is always the case in the first step of each phase in accordance with table II (also see signal INC-p in table III). The other two AND gates 110 and 112 are used to load the AND array 6. Their function will be described further on.

The reset signal RT1 for column 1 of array 6 is generated by the two logic gates 116 and 118, the function of which corresponds to that of the two logic gates 104 and 102. The function of the AND gate 120 for column 1 corresponds to that of the AND gate 106 for column 0. The three logic gates 122, 124 and 126 for column 1 function in the same way as the logic gates 108, 110 and 114 for column 0. The above-mentioned AND gate 112 is provided only for column 0 and serves to load the dummy line UEL, as will be described below. The logic gates 116 to 126 shown for column 1 also exist for columns 2 to p−1 of the AND array 6, so that, for example, the outputs of the AND gates 104, 116, etc., reset the whole AND array, resetting of each column of array 6, i.e., of the whole array 6, being effected at the time of the A-clock (FIG. 7). The other inputs for array 6, i.e., lines ST 0, SR 0; ST 1, SR 1; etc., for the remaining columns, are activated at the time of the B-clock. Before a column is set anew the whole array is reset.

Figure 9:
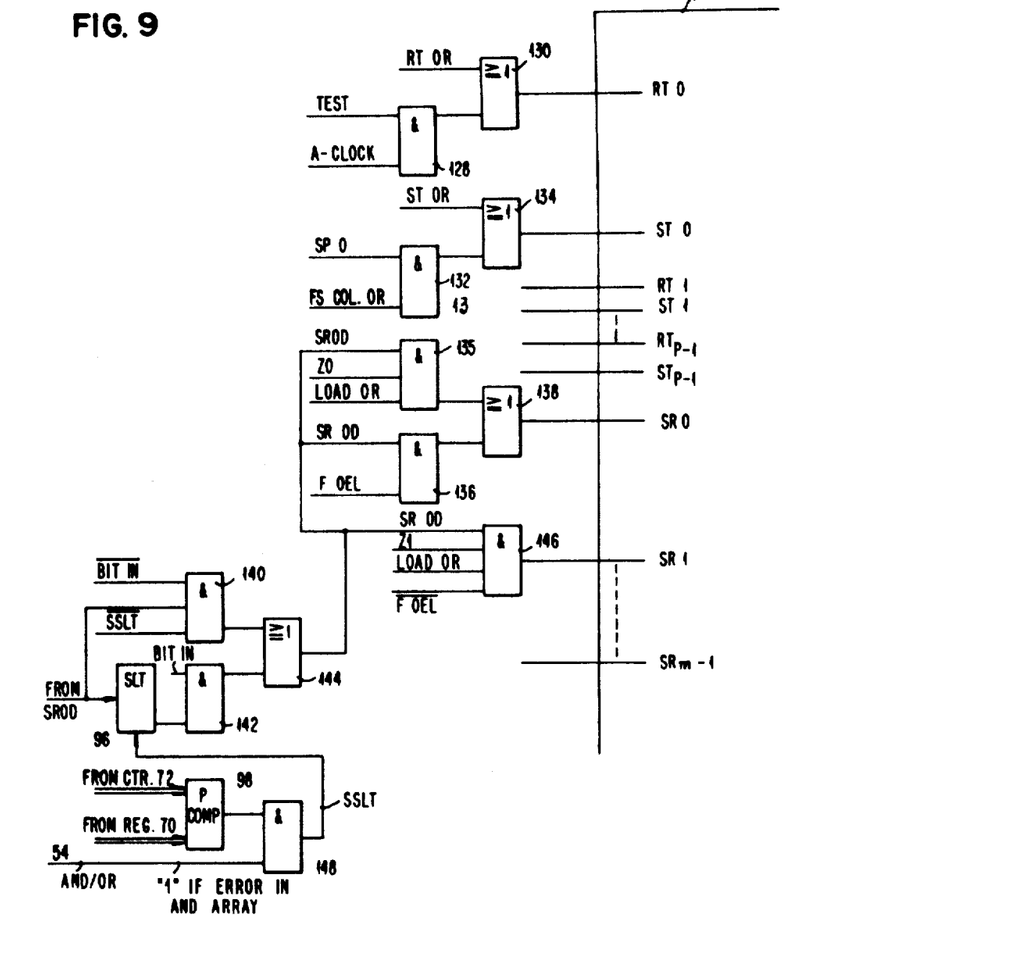

The m-control logic 94 shown in FIG. 6 will be described in detail below by means of FIG. 9. For testing in accordance with tables I to III, reset and set signals are required only for the flip-flop circuits of a whole column of OR array 7. Rippling of a set state of an individual flip-flop circuit in the shift registers of array 7 is not required during the test process, so that signals for the inputs of the shift registers of array 7, which are arranged linewise, are used only during the loading of array 7. These input signals for the shift registers are designated as SR 0, SR 1 to $SR_{m-1}$ in FIG. 9. Their generation will be described in detail below by means of the load process.

A reset signal RT 0 for the flip-flop circuits of column 0 in array 7 is generated by OR gate 130 which is fed by control signal RT OR and the output of AND gate 128. The inputs of AND gate 128 are made up of the control signal TEST and the signal A-clock. Similar to column 0, the means generating a reset signal RT 1, RT 2, ... to $RT_{p-1}$ are designed to comprise a suitable OR gate and a suitable AND gate. The input signals for these logic gates are the same as for column 0. A column of the OR array is set if either the whole set signal ST OR is applied to OR gate 134 or a signal is received from AND gate 132 when a column—in this case column 0—is selected and the increment signal FS COLUMN OR is applied (e.g., test phases 3, 4, step 2p, etc.). For the remaining columns logic gates corresponding to gates 128 to 134 are provided. The remainder of FIG. 9 will be described by means of the load process.

Table IV (page 34) shows the control signals necessary for loading. As previously mentioned, the PLA has to be reloaded after each test sequence. If testing is effected on a routine basis, say, in the morning before the system is switched on, errors are generally not likely to occur, and the two dummy lines UEL and OEL need not be used. If the load process is the result of a test process initiated by an error, it is necessary to load either the dummy line UEL if a column line is defective or the dummy line OEL if an output line of the PLA is defective or corresponding transistor defects have occured. If the dummy line UEL is activated, the binary pattern, which was previously loaded in the shift registers belonging to the erroneous column, has to be loaded into shift register 0, i.e., into stages LU 00 to LU 30. In addition, the stages belonging to the erroneous column have to be set to zero in the OR array, and the binary pattern provided for these stages has to be loaded into stages LO 00 to LO 30 belonging to dummy line UEL.

If an output line AL of the OR array 7 is defective, the binary pattern provided for the shift register of the erroneous line has to be loaded into the shift register belonging to dummy line OEL, i.e., into stages LO 00 to LO 04. While the shift registers serving to personalize and test the PLA are arranged columnwise in the AND array, they are arranged linewise in OR array 7. Thus, the AND array has p shift registers, because there are p columns, whereas the OR array has m shift registers.

TABLE IV

| | | | | | | Load Sequence | | | | | | | | | |
|---|---|---|---|---|---|---|---|---|---|---|---|---|---|---|---|
| | LOAD U | LOAD OD | BIT ON | RST-m | RST-p | ST-m | ST ST-p p-value | ST m-value | F UEL | F OEL | SCH | INC-m | DEC-p | INC-p | RST-IL |
| LDU1 | 0 | 0 | 0 | 0 | 0 | 0 | 0 | 1 | 1 | 0 | 0 | 0 | 0 | 0 | 0 | . |
| LDU2 | 0 | 0 | 0 | 1 | 1 | 0 | 0 | 0 | 0 | 0 | 0 | 0 | 0 | 0 | 0 |
| | 1 | 0 | 0 | 0 | 0 | 0 | 0 | 0 | 0 | 0 | 0 | 0 | 0 | 1 | 0 |
| | 1 | | | | | | | | | | | 1 | | | 0 |

TABLE IV-continued

| | LOAD U | LOAD OD | BIT ON | RST-m | RST-p | ST-m | ST-p | Load Sequence ST p-value | ST m-value | F UEL | F OEL | SCH | INC-m | DEC-p | INC-p | RST-IL |
|---|---|---|---|---|---|---|---|---|---|---|---|---|---|---|---|---|
| LOAD SP1 | . | | | | | | | | | | | . | | . | | |
| | 1 | | | | | | | | | | | 1 | | | 0 | 0 |
| LOAD SP2 | . | | | | | | | | | | | | | . | | |
| SP$_{p-2}$ | . | | | | | | | | | | | | | | | |
| LOAD SP | 1 | | | | | | | | | | | 0 | | | 1 | 0 |
| | 1 | | | | | | | | | | | 1 | | | 0 | . |
| p − 1 | 1 | 0 | 0 | 0 | 0 | 0 | 0 | 0 | 0 | 0 | 0 | 1 | 0 | 0 | 0 | 0 |
| | 1 | 0 | 0 | 0 | 0 | 0 | 1 | 0 | 0 | 1 | 0 | 0 | 0 | 0 | 0 | 0 |
| LOAD DUMMY LINE | 1 | | | | | | 0 | | | | 1 | 1 | | | | . |
| UEL | 1 | 0 | 0 | 0 | 0 | 0 | 0 | 0 | 0 | 1 | 0 | 1 | 0 | 0 | 0 | 0 |
| LD0 | 0 | 0 | 0 | 0 | 1 | 0 | 0 | 0 | 0 | 0 | 0 | 0 | 0 | 0 | 0 | 0 |
| LINE 1 | 0 | 1 | 0 | | 0 | | | | | | | 0 | 1 | 1 | 0 | 0 |
| | . | . | . | | | | | | | | | 1 | 0 | 1 | | |
| | 0 | 1 | 1 | 0 | 0 | 0 | 0 | 0 | 0 | 0 | 0 | 1 | 0 | 1 | 0 | 0 |
| LOAD LINES 2 to m − 2 | . | . | | | | | | | | | | . | | | | . |
| | 0 | 1 | 0 | 0 | 0 | 0 | 0 | 0 | 0 | 0 | 0 | 0 | 1 | 1 | 0 | 0 |
| LOAD LINE m − 1 | . | . | . | | | | | | | | | 1 | 0 | 1 | | . |
| | 0 | 1 | 0 | | | | | | | | | 1 | 0 | 1 | | |
| | 0 | 1 | 1 | 0 | 0 | 0 | 0 | 0 | 0 | 0 | 0 | 1 | 0 | 1 | 0 | 0 |
| LOAD DUMMY LINE | 0 | 1 | 0 | 0 | 0 | 1 | 0 | 0 | 0 | 0 | 1 | 0 | 0 | 1 | 0 | 0 |
| | 0 | 1 | 0 | 0 | 0 | 0 | 0 | 0 | 0 | 0 | 1 | 1 | 0 | 1 | 0 | 0 |
| | . | . | . | | | . | | | | | . | . | | . | . | . |
| | 0 | 1 | 0 | 0 | 0 | 0 | 0 | 0 | 0 | 0 | 1 | 1 | 0 | 1 | 0 | 0 |
| OEL | 0 | 1 | 1 | 0 | 0 | 0 | 0 | 0 | 0 | 0 | 1 | 1 | 0 | 1 | 0 | 0 |

The loading of the AND array 6 will be described below by means of table IV. The control signals generated by test storage 66 in connection with table IV are shown in a readily understandable manner. The effects these signals have during the individual steps of the load process will be explained by means of FIGS. 6 to 9.

Before the shift registers in the individual columns of the matrix are loaded, two enable stage LDU1 and LDU2 are required to store the error identification information in the case of an error signal TF. In step LDU1 the count of the p-counter 72 is transferred to register 70. If an error in the OR array 7 has been detected, a signal on one of the lines 48 to 52 indicates the respective erroneous output line of array 7, to which a particular value for the line index m corresponds. The respective line 48, 50 or 52 generates, via coder 82, a binarily coded signal which is stored in register 84. Line 48, 50 or 52 also resets (signal RST IL) flip-flop circuit IL belonging to the erroneous line.

In the next step LDU2 the two counters 72 and 86 can be reset. This is followed by loading column 1 of the AND array. As the dummy line column 0 is initially not loaded, the p-counter 72 is incremented to 1 by the signal INC−p. This counter then addresses the storage 76 containing the load information for AND array 6, the corresponding information for column 1 being subsequently read into the shift register SRU 78. Thus, the first bit for loading the first column of the AND array is available at the output of shift register 78, being transferred, via the AND gate 124, shown in FIG. 8, and the OR gate 126, to input 12 of shift register SR1 of column 1. In the further steps for loading the first column the shift pulses SCH are fed to shift register 78, and the respective rippled bits are loaded, via AND gate 124, into the input 12 of the shift register of the first column. Shift register 78 and the shift register of the first column are shifted synchronously. After the first column the second column is loaded. In the first step of this load process the p-counter 72 is incremented by 1, and the respective first bit is read from shift register 78 and immediately transferred to AND array 6. After the first bit has been read in, the p-counter stops until the column has been loaded.

Columns 2 to p−1 inclusive are loaded in the same manner as columns 1. The means for addressing the storage 76, for loading the shift register 78 and for shifting said shift register are not shown, since such addressing and shift means are known per se and would only reduce the clarity of the figure. This applies in analogy to time control means used for the transfer of data from storage 76 to AND array 6.

After the last column p−1, the dummy column UEL is loaded. If during the test sequence it is found that a column line of the AND array is erroneous, the information belonging to this column has to be loaded into dummy column 0. In the case of a PLA load process which is not effected after an error has occurred, the respective step of the load process may be suitably skipped, if necessary, or the information 00 . . . 0 stored in storage LDU 76 for column 0 be loaded into the zeroth shift register LU 00 to LU 30. In the first step of the load process of the zeroth column after the occurrence of an error the counter 72 has to be loaded with information on the erroneous column, which is stored in p-register 70. The signal F UEL, which practically forces the address p=0, is applied to AND gate 112, so that the bits read from the shift register 78 may be read, via the AND gate 112 and the OR gate 114, into input 10 of the shift register SRO of the zeroth column. The further process is analogous to that employed for loading the columns 1 to p−1. By means of the count stored in the p-counter, storage 76 is addressed and the corresponding information concerning the erroneous column of the AND arry is loaded into register 78, whence it is read into the AND array. The input $\overline{F\ UEL}$ for the AND gate 124 belonging to this column is missing, so that the information read from shift register SRU, rather than being read into the erroneous column via AND gate 112 and OR gate 114, is transferred to shift register 0. However, the loading of the erroneous column in the AND array has no adverse effects, as this column is reset to 0 in the OR array.

During the selection of column 0 (signal SPO), the column 0 of array 6 may also be loaded via AND gate 110 by means of corresponding information from storage 76.

After the AND array 6, OR array 7 is loaded. However, in the OR array the shift registers are arranged linewise, so that the bit read first into one of the inputs 30 to 36 is finaly stored in shift register LO 04 to LO 34 of the last column p−1. For each shift register arranged linewise, the information to be stored in the flip-flop circuits of the zeroth column belonging to dummy line UEL has to be read in at the end. For loading OR array 7 two pecularities have to be considered: 1. Loading in the case of one erroneous column line and 2. loading in the case of one erroneous output line of the OR array.

If a column-shaped product line PL is defective, the flip-flop circuits belonging to this product line have to be reset to 0 in the OR array 7, and the information previously stored in these flip-flop circuits has to be stored in the flip-flop circuits of column 0. This loading of the zeroth column of the OR array 7 is effected automatically during the load process of the OR array. For this purpose, reference is made to FIG. 9 and the loading of the first line Z1 is described. As an enable step LDO 1, it is only necessary to reset the p-counter 72. In the next step the m-counter 86 which is still at 0 is switched to 1, thus addressing the first line of the OR array. The p-counter which is at 0 is decremented by 1, so that subsequently it is at maximum capacity, indicating the column p−1. Thus, the bit belonging to the column p−1 is read into the input 32 of the shift register. For this purpose, the counter 86 addresses the load storage LDO 90 of the OR array, and the information belonging to the addressed line is read into the shift register SROD 92. During this process, the first bit from this shift register simultaneously reaches shift register SR1 of line Z1 of the OR array via AND gate 146 (FIG. 9). The signal Z1 is applied to the inputs of AND gate 146, since the counter 86 indicates the first line, so that the decoder 88 selects the first line by signal Z1. During the whole load process of the OR array, the signal LOAD OR is also applied. In FIG. 9 the load path from register 92 generally extends via AND gate 140 and OR gate 144. The output of this OR gate is connected to AND gates, such as 146, for all lines of the OR array. The signal BIT ON serves to load the dummy line OEL and is 0 during the normal load process of the OR array 7, so that this input is applied to AND gate 140. During the normal load process of the OR array, the signal SSLT, whose significance will be explained further on, is also 0, so that this input to the AND gate 140 is also fulfilled. Loading of the shift register for the first line of OR array 7 subsequently proceeds by shift pulses SCH being applied to the shift register SROD and the contents of shift register 92 being read into shift register LO 10 to LO 14 belonging to the first line. Loading of the remaining lines 2 to m−1 is effected in the same manner, with the m-counter 36 being incremented by 1 (signal INC−m) at the beginning of the load process of each line. Then storage 90 is addressed, and the corresponding information is read into shift register 92, whence the first bit is directly applied to the respective input 32, 34 or 36. The further bits for the shift register to be loaded are applied to the respective input 32, 34 or 36 by shifting shift register 92. If the load process of the OR array 7 is the result of an error on one of the product lines PL, the respective column has to be set to 0 in the OR array 7, as previously described, and the respective information has to be loaded into column 0. Thus, during the load process of the OR array, the count of the downward counting counter 72 is continuously compared by the p-comparator 98 (FIG. 9) with the count stored in p-register 70, which indicates the erroneous column. If, for example, product line PL4 corresponding to column p−1 is erroneous, a signal is applied to the output of comparator 98 when the respective bit in the first load step of a line of the OR array is read from shift register SROD and read into the m-control logic 94 (FIG. 9). A signal is also applied to the second input to AND gate 148, as line 54 (FIG. 2) indicates that an error has occurred in AND array 6. Thus, a signal SSLT enabling the flip-flop circuit 96 is received at the output of AND gate 148, so that the respective bit can be read from shift register 92 into the flip-flop circuit. Simultaneously, the input $\overline{SSLT}$ to AND gate 140 is eliminated, so that the respective bit cannot be transferred through said gate. As the input BIT ON to AND gate 141 is also 0, the binary signal 0 is read by the two AND gates 140 and 141, so that this 0-bit is thus read into the input of the shift register of the line just considered in AND array 7. If the line concerned is line Z1, the binary value 0 is stored in flip-flop circuit LO 14. In the last step of the load process of a line of the OR array the flip-flop circuit of the zeroth column of the OR array is loaded. In the assumed example of loading the first line this would be the flip-flop circuit LO 10. During the last load step of the shift register of a line the signal BIT ON is 1, so that in FIG. 9 the AND gate 142 is switched through, causing the value stored in flip-flop circuit 96 to be set in flip-flop circuit LO 10 via OR gate 144 and AND gate 146 (provided that the first line is loaded).

The same process is repeated during the loading of the shift registers belonging to the remaining lines 1 to m−1. Every time the count of the downward counting counter 72 matches the count in p-register 70, which indicates the erroneous column line, the respective bit is stored in the flip-flop circuit 96 and a 0 is transferred instead to the respective input 32, 34 or 36. In the last step of loading the shift register of a line, the stored bit from the flip-flop circuit 96 is set in the flip-flop circuit of the zeroth column of the OR array contains the binary pattern which was previously stored in the flip-flop circuits to the erroneous column line. Subsequently, the erroneous column contains only zeroes, so that the erroneous line does not contribute to the PLA output signal.

As the last phase of the load process, the loading of the shift register consisting of stages LO 00 to LO 04 and belonging to dummy line OEL will be described. At the beginning of this phase, the value stored in m-register 84, which indicates the erroneous line of the OR array 7, is transferred to m-counter 86, so that the respective line is indicated at the output of decoder 88 and shift register information belonging to the respective line is addressed in storage 90. If, for example, line 1 is erroneous, the decoder 88 generates the signal Z1, so that it is nevertheless impossible for information read from shift register 92 to be applied to input 32 of the shift register of the first line, as at that stage signal F OEL is 1, thus eliminating an input to AND gate 146. If this signal F OEL then switches AND gate 136, the information read from shift register SROD can be read into the input of the shift register of the zeroth line via AND gate 136 and OR gate 138. The further loading of the zeroth shift register is initiated by shift pulses SCH for shift register 92.

A further possibility of loading the zeroth shift register consists in using the normal selection Z0 and the AND gate 135.

As the occurrence of an error in a column line causes the flip-flop circuits belonging to the erroneous column to be set to 0 the OR array 7, the original information can be maintained in, i.e., need not be erased from, the flip-flop circuits in the AND array 6, which belong to this erroneous column.

In the illustrated embodiment, a column dummy line and a line dummy line are provided for the OR array. Although this has the great advantage that in the case of a PLA error operation can be resumed after a short test and load phase, this applies only to the first error encountered. If one of the dummy lines has been used in this manner, the operation of the PLA cannot be restored, as described, in the case of the next error. This shortcoming is eliminated by providing several column and/or several line dummy lines. In this case means are required indicating the next dummy line to be used. Also required are several signals F UEL and F OEL together with the appertaining gate circuits, such as AND gates 136 and 112.

Although in the illustrated embodiment the individual shift registers of the AND and the OR array are successively loaded, it is also possible to load all shift registers simultaneously, for which purpose it may be necessary to serially read the load information contained in storages 76 and 90.

As the error detection and correction means as well as the load means shown in FIGS. 5 to 9 are used only sporadically and only for a short time, it is sufficient to provide such means only once for several PLAs, using, if necessary, separate load storages 68 for each PLA.

While the invention has been particularly shown and described with reference to a preferred embodiment thereof, it will be understood by those skilled in the art that various changes in form and detail may be made therein without departing from the spirit and scope of the invention.

Having thus described our invention, what we claim as new, and desire to secure by Letters Patent is:

1. A programming logic array (PLA) having an AND array and an OR array with input lines to the AND array, output lines from the OR array, and product term lines interconnecting the two arrays, the PLA having storage flip-flops at the cross points of the arrays, wherein the improvement comprises,
    means connecting the flip-flops along individual product term lines of the AND array and along individual output lines of the OR array to form shift registers,
    means for sequentially loading data for a test sequence into the shift registers of the PLA,
    whereby the array can be tested to locate faults, and dummy lines in the array connectable to replace a line in which a fault is detected.

2. A PLA in accordance with claim 1, wherein the means for loading test sequence data comprises,
    a test storage and a load storage and a step counter for addressing the test storage and load storage,
    means responsive to the occurrence of an error in the PLA during a test to reset the counter to the beginning address for a test sequence.

3. A PLA in accordance with claim 2, including
    a test comparator (44, FIG. 2) comparing the output signals of the PLA with desired values, and a comparison evaluator indicating whether, upon the occurrence of a test error, the test comparator has determined a mismatch of all output signals of the PLA and the desired value, or only a mismatch of the signal on a single output line of the PLA and the desired value, the former case being indicative of an error in the AND array and the second case being indicative of an error in the OR array.

4. A PLA in accordance with claim 3, wherein
    the comparison evaluator comprises a number of indicator lines corresponding to the number of output lines, whereby, in the case of an error in the OR array, one and only of said lines indicates which output line is erroneous, and means for switching out the erroneous output line and switching in an OR dummy line is switched on instead.

5. A PLA in accordance with claim 2, wherein the means for loading test sequence data comprises,
    p-control logic means and m-control logic means connected to receive control signals from the test storage, and
    means connecting the p-control logic means for column addressing of the AND array and connecting the m-control logic for addressing column and row addressing of the OR array.

6. A PLA in accordance with claim 3, including
    a p-counter, a p-register connected to be loaded from the p-counter, and a p-decoder for addressing the AND array from the p-register,
    an m-counter, an m-register connected to be loaded from the m-counter, and an m-counter for addressing the OR array from the m-register, and
    means responsive to a test error for loading the p-register and the m-register from the p-counter and the m-counter.

7. A PLA in accordance with claim 6, including
    a coder for converting the signal received on one of the indicator lines of the comparison evaluator into a coded representation of the respective line, and means connecting the output of the coder to a further input of the m-register.

8. A PLA in accordance with claim 6, characterized in
    means connecting the p-counter to address the load storage for the AND array, a first shift register connected to receive the output, whose output, via the p-control logic, can be connected to the input of the shift register of the AND array indicated by the p-decoder, and in
    that the output of the m-counter addresses a load storage for the OR array, whose output is connected to a second shift register, the output signal of which, via the m-control logic can be connected to the input of the shift register of the OR array indicated the the m-decoder.

9. Array in accordance with claim 8, characterized in that the output of the second shift register (92) is connected to the input of a first AND gate (140, FIG. 9) and the input of a flip-flop circuit (96, FIG. 9), the output of which, via a second AND gate (142), is connected to one input of a first OR gate (144), the other input of which is connected to the output of the first AND gate (140), whereby an enable input of the flip-flop circuit is connected to the output of a third AND gate (148), the two inputs of which are connected to the AND/OR indicator line (54) of the comparison evaluator (46) and to the output of a p-comparator (98), whereby the two compare inputs of the comparator are connected to the output of the p-counter (72) counting downwards from the maximum value and to the output of the appertaining p-register (70), in such a manner that during the normal load process the bit read from the second shift register (92) is read, via the first AND gate (140), into the respective shift register of the OR array (7), but that the bit to be loaded is stored in the flip-flop circuit (96) if the p-comparator (98) supplies an output signal and an error was detected in the AND array (6) (signal on line 54), so that at that time a binary zero is loaded, via the first OR gate (144), into the OR array and the flip-flop circuits of the OR array belonging to the erroneous column are loaded with binary zeroes.

10. Array in accordance with claim 9, characterized in that during the last load step of a shift register of the OR array, a first force signal (BIT ON, table IV) is generated, switching the output of the flip-flop circuit (96), via the first OR gate (144), to the flip-flop circuit of the zeroth column of the OR array (7) in such a manner that the flip-flop circuits (LO 00 to LO 30) of the OR array belonging to the zeroth column (FIG. 2, left-most part) are loaded with the original contents of the flip-flop circuits of the erroneous column.

11. Array in accordance with claim 7, characterized in that for loading the dummy line (OEL) of the array (7), the contents of the m-register (84) are transferred to the m-counter (86), and that by a second force signal (F OEL), a fourth AND gate (136) is activated, switching the output of the second shift register (92), via the fourth AND gate, to the input (30) of the shift register (SRO, LO 00 to LO 04) belonging to the dummy line.

12. Array in accordance with claim 6, characterized in that for loading the shift register (LU 00 to LU 30) belonging to the AND dummy line (UEL), the count stored in p-register (70) is transferred to the p-counter (72), and that by a third force signal (F UEL), a fifth AND gate (112, FIG. 8) is switched, so that the output of the first shift register (78) is connected, via the fifth AND gate, to the input (10) of the shift register of the AND dummy line.

13. Array in accordance with claim 1, characterized in that the flip-flop circuits (LU) of the AND array (6) are connected in each case to a first input of an AND gate (58, FIG. 3A), the second, inverting input of which is connected to an input line of the PLA, and the output (Q) of which is connected to the base of a transistor (T), whose collector is connected to a product line (PL), and whose emitter is connected to zero potential.

14. Array in accordance with claim 1, characterized in that the flip-flop circuits (LO) of the OR array (7) are connected in each case to a first input of an AND gate (62, FIG. 4A), the second input of which is connected to a product line, and the output (Q) of which is connected to the base of a transistor (T), whose collector is connected to an output line (AL) of the PLA, and whose emitter is connected to zero potential.

* * * * *